(12) United States Patent
Silevitch et al.

(10) Patent No.: US 8,558,333 B2
(45) Date of Patent: Oct. 15, 2013

(54) SYSTEM AND METHOD FOR MANIPULATING DOMAIN PINNING AND REVERSAL IN FERROMAGNETIC MATERIALS

(75) Inventors: Daniel M. Silevitch, Chicago, IL (US); Thomas F. Rosenbaum, Wilmette, IL (US); Gabriel Aeppli, Hanover, NH (US)

(73) Assignees: The University of Chicago, Chicago, IL (US); UCL Business PLC, London (GB)

( * ) Notice: Subject to any disclaimer, the term of this patent is extended or adjusted under 35 U.S.C. 154(b) by 0 days.

(21) Appl. No.: 13/383,059

(22) PCT Filed: Jul. 9, 2010

(86) PCT No.: PCT/US2010/041485
§ 371 (c)(1),
(2), (4) Date: Mar. 16, 2012

(87) PCT Pub. No.: WO2011/006042
PCT Pub. Date: Jan. 13, 2011

(65) Prior Publication Data
US 2012/0162815 A1      Jun. 28, 2012

Related U.S. Application Data

(60) Provisional application No. 61/270,561, filed on Jul. 10, 2009.

(51) Int. Cl.
*H01L 29/82* (2006.01)
*G11C 11/02* (2006.01)

(52) U.S. Cl.
USPC ........... 257/421; 257/422; 257/423; 257/424; 257/425; 257/427; 438/3; 360/324; 360/324.2; 365/157; 365/171

(58) Field of Classification Search
USPC ........ 257/20, 414, 421–427, E29.323; 438/3; 365/23, 157–158, 171–173; 360/324–326, 313, 97.11; 29/737
See application file for complete search history.

(56) References Cited

U.S. PATENT DOCUMENTS

| 2004/0218310 | A1 | 11/2004 | Nishioka ........................ 360/313 |
| 2005/0242382 | A1* | 11/2005 | Daughton et al. ............. 257/295 |
| 2009/0016098 | A1* | 1/2009 | Wunderlich et al. .......... 365/158 |

OTHER PUBLICATIONS

D.M. Silevitch et al., "Switchable hardening of a ferromagnet at fixed temperature", PNAS 2010 107 (7) 2797-2800; Published online before print Jan. 29, 2010, doi: 10.1073/pnas.0910575107.*

(Continued)

*Primary Examiner* — Jami M Valentine
(74) *Attorney, Agent, or Firm* — Brinks Hofer Gilson & Lione

(57) ABSTRACT

A method for manipulating domain pinning and reversal in a ferromagnetic material comprises applying an external magnetic field to a uniaxial ferromagnetic material comprising a plurality of magnetic domains, where each domain has an easy axis oriented along a predetermined direction. The external magnetic field is applied transverse to the predetermined direction and at a predetermined temperature. The strength of the magnetic field is varied at the predetermined temperature, thereby isothermally regulating pinning of the domains. A magnetic storage device for controlling domain dynamics includes a magnetic hard disk comprising a uniaxial ferromagnetic material, a magnetic recording head including a first magnet, and a second magnet. The ferromagnetic material includes a plurality of magnetic domains each having an easy axis oriented along a predetermined direction. The second magnet is positioned adjacent to the magnetic hard disk and is configured to apply a magnetic field transverse to the predetermined direction.

17 Claims, 5 Drawing Sheets

(56) References Cited

OTHER PUBLICATIONS

Smith et al. ('A Homogenized Energy Framework for Ferromagnetic Hysteresis', IEEE Transactions on Magnetics 42,7 (2006), pp. 1749-1769).*

Silevitch et al. ('Ferromagnet in a continuously tuneable random field', Nature, 448, (2007) pp. 567-57.*

International Search Report Application and Written Opinion for International PCT No. PCT/US10/41485, mailing date Sep. 7, 2010, 5 pp.

Aeppli, G., "$LiHo_xY_{1-x}F_4$: The Road Between Solid State ION trap and quantum critical ferromagnet," Conference on Quantum Critical Phenomena, Toronto (2008) 62 pp.

Aharony, A. et al., "Exact Relations among Amplitudes at Critical Points of Marginal Dimensionality," Physical Review Letters, 35,19 (1975) pp. 1308-1310.

Ahlers, G. et al., "Logarithmic Corrections to the Landau Specific Heat near the Curie Temperature of the Dipolar Ising Ferromagnet $LiTbF_4$," Physical Review Letters, 34,19 (1975) pp. 1227-1230.

Belanger, D. P. et al., "Random-Field Critical Behavior of a d=3 Ising System," Physical Review B, 28, 5 (1983) pp. 2522-2526.

Belanger, D. P. et al., "Neutron Scattering and the Critical Behavior of the Three-Dimensional Ising Antiferromagnet $FeF_2$," Physical Review B, 35,10 (1987) pp. 4823-4830.

Belanger, D. P., TheRrandom Field Ising Model, Journal of Magnetism and Magnetic Materials 100 (1991) pp. 272-291.

Birgeneau, R. J., "Critical Behavior of a Site-Diluted Three-Dimensional Ising Magnet," Physical Review B, 27,11, (1983) pp. 6747-6753.

Bitko, D., "Order and Disorder in a Model Quantum Magnet," A Dissertation submitted to The Faculty of the Division of the Physical Sciences, Department of Physics, The University of Chicago, (1997) pp. 1-93.

Bitko, D. et al., "Quantum Critical Behavior for Model Magnet," Physical Review Letters, 77, 5 (1996) pp. 940-943.

Brezin E. et al., "Critical Behavior of Uniaxial Systems with Strong Dipolar Interactions," Physical Review B, 13,1 (1976) pp. 251-254.

Brooke, J. et al., "Tunable Quantum Tunneling of Magnetic Domain Walls," Nature, 413, (2001) pp. 610-613.

Brooke, J. et al, "Quantum Annealing of a Disordered Magnet," Science, 284,(1999) pp. 779-781.

Chakraborty, P. B. et al., "Theory of the Magnetic Phase Diagram of $LiHoF_4$," Physical Review B, 70 (2004) pp. 144411-1-144411-14.

Ferreira, I. B. et al., "Random-Field-Induced Destruction of the Phase Transition of a Diluted Two-Dimensional Ising Antiferrogmagnet: $Rb_2Co_{0.85}Mg_{0.15}F_4$," Physical Review B, 28,9 (1983) pp. 5192-5198.

Fishman, S. et al., Random Field Effects in Disordered Anisotropic Antiferromagnets, Letter to the Editor, J. Phys. C: Solid State Phys., 12, (1979) pp. L729-L733.

Ghosh, S. et al., "Coherent Spin Oscillations in a Disordered Magnet," Science 296, (2002) pp. 2195-2198.

Ghosh, S. et al., "Entangled Quantum State of Magnetic Dipoles," Nature 425, (2003) pp. 938-941.

Gofman, M. et al., "Critical Behavior of the Random-Field Ising Model," Physical Review B, 53, 10, (1996) pp. 6362-6384.

Griffiths, Robert B., Nonanalytic Behavior Above the Critical Point in a Random Ising Ferromagnet, Physical Review Letters, 23,1 (1969) pp. 17-19.

Hansen, P. E. et al., "Magnetic Properties of Lithium Rare-Earth Fluorides: Ferromagnetism in $LiErF_4$ and $LiHoF_4$ and Crystal-Field Parameters at the Rare-Earth and Li sites," Physical Review B, 12,11 (1975) pp. 5315-5324.

Reich, D. H. et al. "Dipolar Magnets and Glasses: Neutron-Scattering, Dynamical, and Calorimetric Studies of Randomly Distributed Ising Spins," Physical Review B, 42,7 (1990) pp. 4631-4644.

Rønnow, H. M. et al., "Quantum Phase Transition of a Magnet in a Spin Bath," Science, 308, (2005) pp. 389-392.

Schechter, M., "$LiHo_xY_{1-x}F_4$ as a Random-Field Ising Ferromagnet," Physical Review B, 77, (2008) pp. 020401-1-020401-4.

Silevitch, D. M. et al., "Ferromagnet in a Continuously Tuneable Random Field," Nature 448, (2007) pp. 567-570.

Slanic, Z et al., "Equilibrium Random-Field Ising Critical Scattering in the Antiferromagnet $Fe_{0.93}Zn_{0.07}F_2$," Physical Review Letters, 82, 2 (1999) pp. 426-429.

Smith, Ralph C. et al, "A Homogenized Energy Framework for Ferromagnetic Hysteresis," IEEE Transactions on Magnetics 42,7 (2006) pp. 1749-1769.

Tabei, S.M.A. et al., "Induced Random Fields in the $LiHo_xY_{1-x}F_4$," Physical Review Letters, 97, (2006) pp. 237203-1-237203-4.

Torres-Ancona, C. et al., "Quantum and Classical Glass Transitions in $LiHo_xY_{1-x}F_4$," Physical Review Letters, 101, (2008) pp. 057201-1-057201-4.

Wu, W. et al., "From Classical to Quantum Glass," Physical Review Letters, 67,15 (1991) pp. 2076-2079.

Yoshizawa, H. et al., "Random-Field Efects in Two- and Three-Dimensional Ising Antiferromagnets,"Physical Review Letters, 48, 6 (1982) pp. 438-441.

* cited by examiner

FIG. 3A
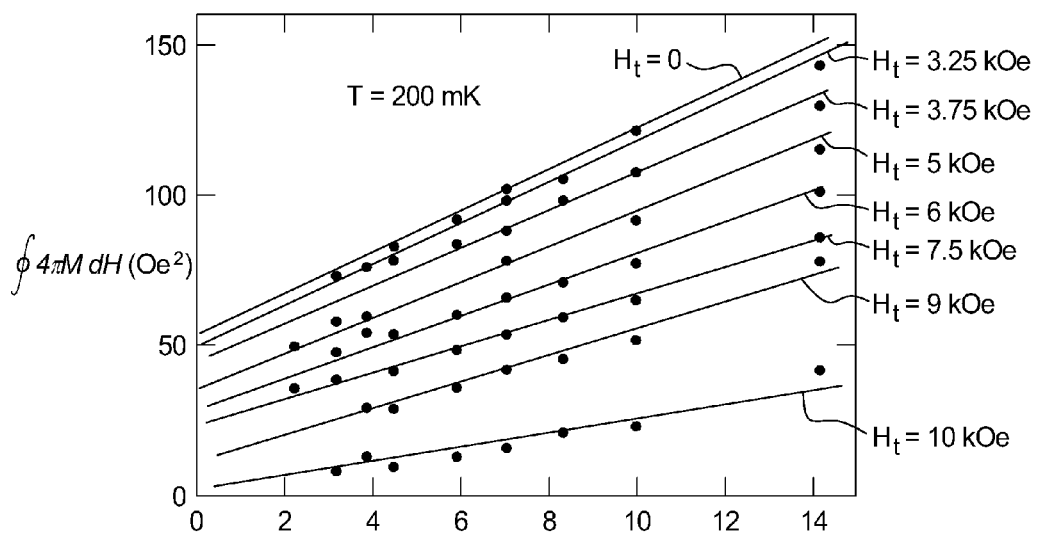
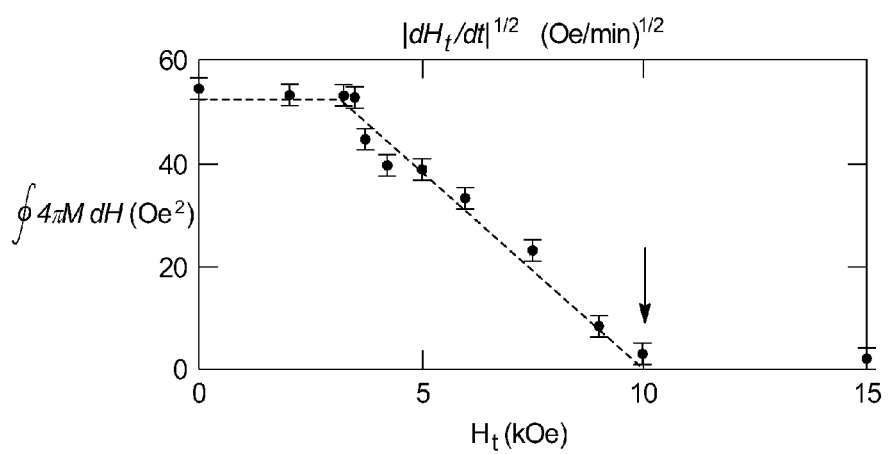
FIG. 3B

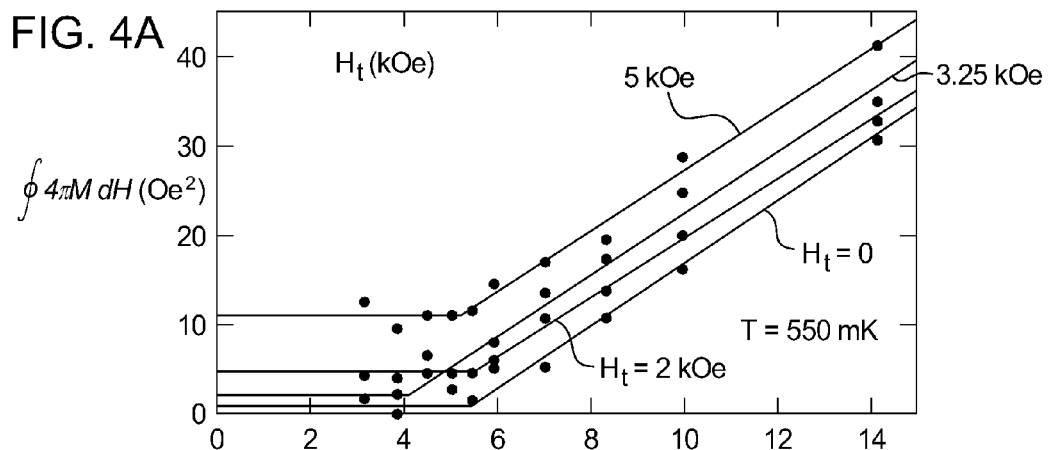
FIG. 4A
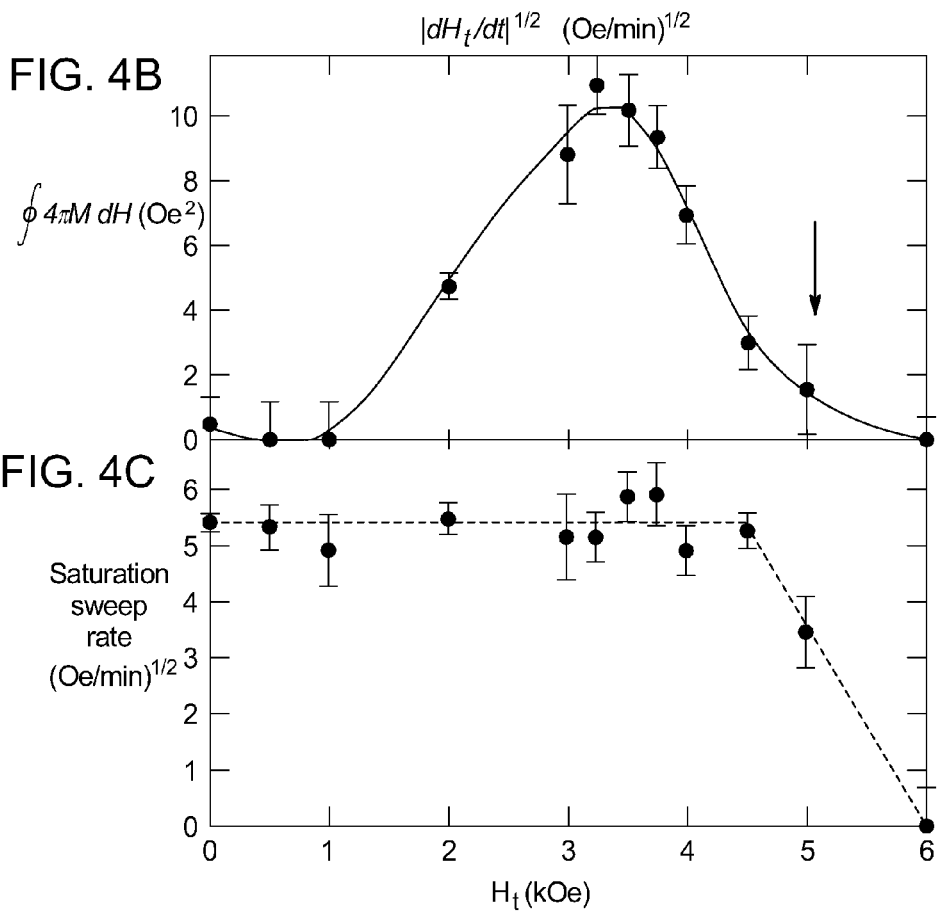
FIG. 4B
FIG. 4C

SYSTEM AND METHOD FOR MANIPULATING DOMAIN PINNING AND REVERSAL IN FERROMAGNETIC MATERIALS

RELATED APPLICATIONS

The present patent document is the national stage of International Patent Application PCT/US2010/041485, filed on Jul. 9, 2010, which claims the benefit of the filing date under 35 U.S.C. §119(e) of U.S. Provisional Patent Application Ser. No. 61/270,561, filed Jul. 10, 2009, both of which are hereby incorporated by reference.

FEDERALLY SPONSORED RESEARCH OR DEVELOPMENT

This invention was made with U.S. government support under grant number DEFG02-99ER45789 from the Department of Energy (DOE) Basic Energy Sciences. The U.S. government may have certain rights in this invention.

TECHNICAL FIELD

The present disclosure is related generally to ferromagnetic materials and more particularly to a method for tuning the dynamics of magnetic domains in ferromagnetic materials.

BACKGROUND

The intended use of a magnetic material, from information storage to power conversion, depends crucially on its domain structure, traditionally crafted during materials synthesis. It is no accident that techniques to mechanically and magnetically harden materials coincide. The same impurities and grain boundaries that prevent dislocations from flowing prevent magnetic domains from switching. Strategies to pin magnetic domains typically are implemented during materials preparation by varying the composition, structure, and morphology, locking in a set of properties that cannot be modified subsequently. Of particular technological interest is ultra-high density magnetic storage, where bits may be warmed close to or above their ferromagnetic transition temperature for writing and then cooled for long-term retention and reading. Although such heat-assisted magnetic recording approaches have enabled improvements in storage density, the technologies introduce new complexities and thermodynamic challenges, such as preserving the states of bits adjacent to those being written.

BRIEF SUMMARY

An external magnetic field applied transverse to the preferred magnetization of a disordered uniaxial ferromagnet can serve as an isothermal regulator of domain pinning. At elevated temperatures, such as near the transition into the paramagnet, modest transverse fields increase the pinning, stabilize the domain structure, and harden the magnet, until a point where the field induces quantum tunneling or other relaxation of the domain walls and softens the magnet. At very low temperatures, tunneling may dominate the domain dynamics and provide an interpretation of the quantum phase transition in highly disordered magnets as a localization/delocalization transition for domain walls.

A method for manipulating domain pinning and reversal in magnetic materials is disclosed that comprises applying an external magnetic field to a uniaxial ferromagnetic material comprising a plurality of magnetic domains, where each magnetic domain has an easy axis oriented along a predetermined direction. The external magnetic field is applied transverse to the predetermined direction and at a predetermined temperature. The strength of the transverse magnetic field may be varied at the predetermined temperature, thereby isothermally regulating pinning of the magnetic domains.

Also described herein is a magnetic storage device configured for isothermal regulation of domain pinning. The storage device includes a magnetic hard disk comprising a ferromagnetic material having uniaxial anisotropy. The ferromagnetic material comprises a plurality of magnetic domains each having an easy axis oriented along a predetermined direction. The storage device also includes a magnetic recording head comprising a first magnet and being spaced apart from the magnetic hard disk by a head-disk spacing, and a second magnet adjacent to the magnetic hard disk and configured to apply a magnetic field transverse to the predetermined direction.

A magnetic storage device, such as a magnetic random access memory (MRAM) device, configured for isothermal control over domain dynamics is also described. The MRAM device includes a memory cell including a free ferromagnetic layer separated from a pinned ferromagnetic layer by an insulating layer, where the pinned ferromagnetic layer is adjacent to an antiferromagnetic layer. Each of the free ferromagnetic layer and the pinned ferromagnetic layer comprise a plurality of magnetic domains, where the domains of the free ferromagnetic layer have an easy axis oriented along a first direction and the domains of the pinned ferromagnetic layer have an easy axis oriented along a second direction. A first electrode overlies the memory cell, and a second electrode underlies the memory cell and runs perpendicular to the first electrode. A magnet is adjacent to the memory cell and is configured to apply a magnetic field transverse to at least one of the first and second directions.

BRIEF DESCRIPTION OF THE DRAWINGS

FIG. 1A is a schematic of domain configuration in an Ising ferromagnet. The top row shows reversal in a classical regime, with sharply defined domains centered on individual local pinning sites. The bottom row shows reversal in a quantum tunneling regime, where quantum fluctuations broaden the walls and average the effects of the local pinning centers. FIG. 1B is a schematic showing the analogy between domain wall tunneling and the quantum mechanics of particles propagating in a random medium. FIG. 1C illustrates a phase diagram for $LiHo_{0.44}Y_{0.56}F_4$, showing a crossover between classical, thermal barrier hopping (right) and quantum-tunneling (left) regimes. Ferromagnet/paramagnet phase boundary from J. Brooke, T. F. Rosenbaum, G. Aeppli, *Nature* 413, 610-613 (2001).

FIGS. 3A-3B illustrate rate-dependent dissipation for $LiHo_{0.44}Y_{0.56}F_4$ in the quantum regime. FIG. 3A illustrates an area enclosed by hysteresis loops at T=200 mK and $H_t$=0, 3.25, 3.75, 5, 6, 7.5, 9, 10 kOe vs. the square root of the sweep rate of the longitudinal magnetic field. Lines are fits to A(dH/dt)=$A_0+A_1\sqrt{dH/dt}$. FIG. 3B illustrates long-time-limit enclosed area vs. transverse field. The area enclosed by the loop decreases monotonically with increasing transverse field, vanishing at the paramagnetic phase boundary. Lines are guides to the eye. Arrow shows T=200 mK ferromagnetic-paramagnetic phase boundary measured independently via ac magnetic susceptibility.

FIGS. 4A-4C illustrate rate-dependent dissipation for $LiHo_{0.44}Y_{0.56}F_4$ in the classical random-field regime. FIG. 4A illustrates an area enclosed by hysteresis loops at T=550 mK and $H_t$=0, 2, 3.25, 5 kOe vs. the square root of the sweep rate of $H_l$. Curves are fits to a threshold rate plus a square root sweep rate dependence. FIG. 4B illustrates long-time-limit enclosed area vs. transverse field. Increases in random-field pinning results in a peak in the curve at $H_t$=3.5 kOe. Curve is a guide to the eye. Arrow shows T=550 mK ferromagnetic-paramagnetic phase boundary. FIG. 4C shows crossover time between equilibrium and activated regimes, showing a constant time until the transition to paramagnetism is reached. Lines are guides to the eye.

DETAILED DESCRIPTION

Figure 1A:
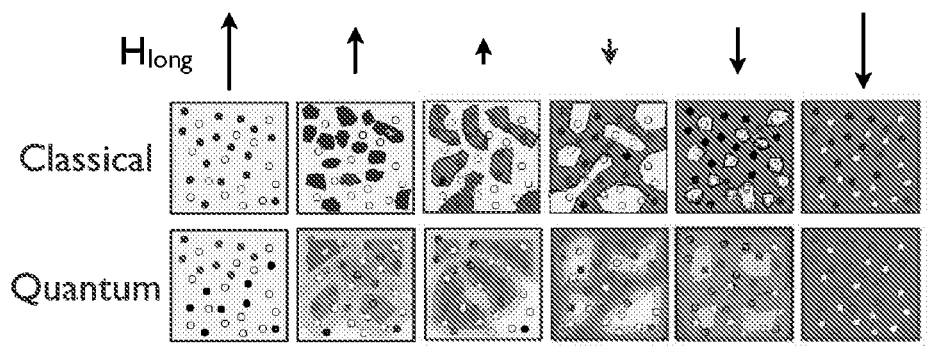
FIGS. 1A-1C illustrate an overview of random-field-enhanced domain pinning.

Described herein are a method and apparatus for the isothermal control of magnetic domain dynamics based on application of an external magnetic field transverse to the preferred magnetization of a uniaxial ferromagnet. The effect may rely on two competing mechanisms, the first associated with classical random fields and the second with quantum tunneling and/or thermally assisted motion of magnetic domains. The laboratory control of tunneling probabilities via the simple application of a transverse field permits a clear delineation of quantum criticality as the result of the quantum tunneling-induced dissolution and depinning of domain walls. A demonstration experiment carried out on a rare earth fluoride and described below shows that, at elevated temperatures near the zero-field Curie point of a ferromagnet, hardening occurs due to increased pinning with a modest transverse field. This is technologically important because it demonstrates the possibility of non-thermal control of magnetic domain dynamics.

This approach to regulating magnetization reversal in real materials is based on the random-field Ising model (RFIM), where a site-random magnetic field acts to orient magnetization locally in competition with the underlying exchange couplings that favor homogeneous magnetism. Random fields act on ferromagnets via their pinning of domain walls, creating barriers to motion that increase with random field amplitude. The rising barrier height decreases the probability of reversal at a given applied field, and if the amplitude of the random field contribution can be controlled continuously, then the pinning potential can be increased or decreased on demand. There is extensive experimental literature on the properties of the RFIM. Until recently, however, the work has been confined to site-diluted antiferromagnets, which lack a net magnetization and hence are unsuited for examining domain reversal dynamics. Instead, the reversal dynamics of the RFIM have been studied via simulations, focusing largely on the properties of avalanches and related phenomena.

Figure 1B:
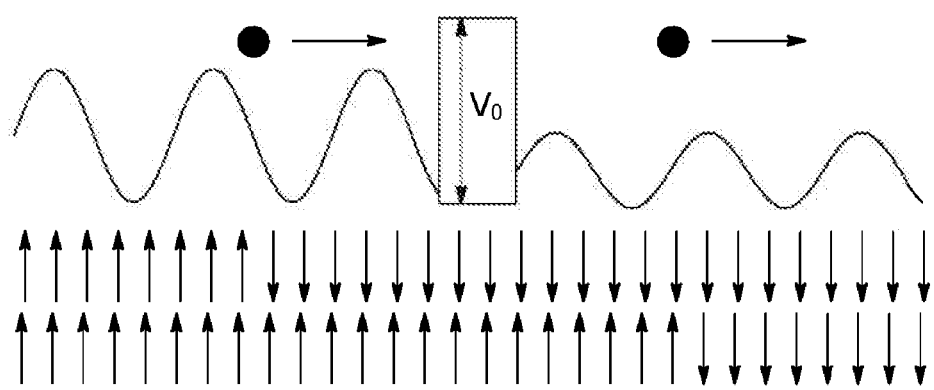
Figure 1C:
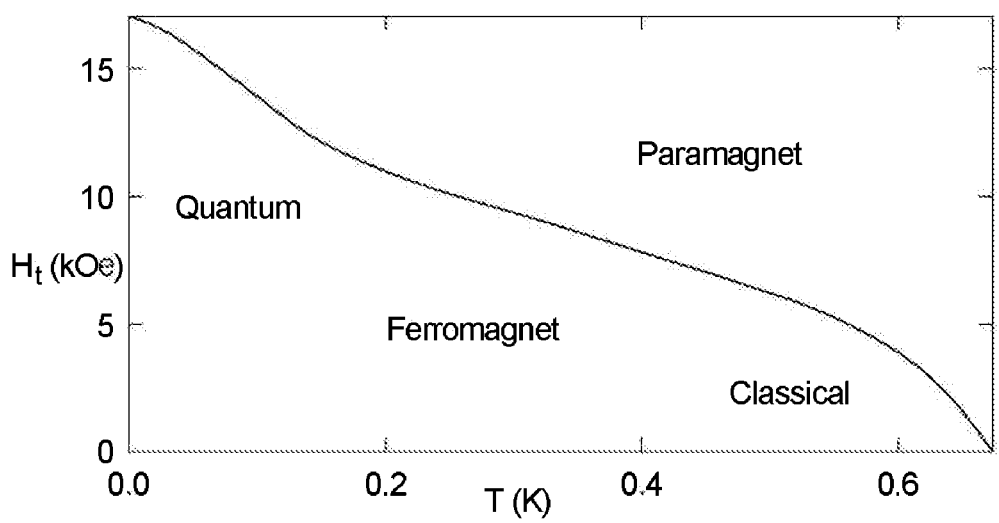

For a tuneable random field in a ferromagnet, $LiHo_xY_{1-x}F_4$ salts, which can be described by the S=½ Ising model, may be used. The parent compound, $LiHoF_4$, is a dipolar-coupled ferromagnet with Curie temperature $T_C$=1.53 K. Partially substituting nonmagnetic yttrium for the magnetic holmium atoms results in a suppression of $T_C$ with a breakdown of the long-range ordered state for x<0.3. Experiment and theory demonstrate that the combination of the random dilution of the magnetic ions, the off-diagonal components of the dipole interaction, and the application of a magnetic field transverse to the Ising axis produce a site-random field along the Ising axis whose strength scales with the external transverse field. $LiHo_xY_{1-x}F_4$ for x>0 is thus a ferromagnetic realization of the RFIM. Moreover, the transverse field also can affect the dynamics by adding a $\sigma_x$ term to the Hamiltonian, mixing the original eigenstates and providing a quantum tunneling pathway for domain reversal. The effective Hamiltonian is then:

$$\hat{H}=-\Sigma J_{ij}\sigma_i^z\sigma_j^z-\Sigma h_i\sigma_i^z-\Gamma\Sigma\sigma_i^x, \qquad (1)$$

where $J_{ij}$ is the interspin coupling along the Ising axis, $h_i$ is the random field term proportional to the external transverse field $H_t$, and $\Gamma \propto H_t^2$ sets the scale of the quantum tunneling rate. The dynamics of domain growth and reversal depend on which of the latter two terms in Eq. (1) dominate, as illustrated in FIG. 1A. In a regime where the random-field effects control the behavior, domains nucleate at pinning sites corresponding to local maxima in the random field and have sharp well-defined walls whose shape is determined by the distribution of these pinning sites. When quantum tunneling dominates, the Heisenberg uncertainty principle implies broadened domain walls, averaging out the effects of any local pinning centers. In this tunneling regime, propagation of a domain wall follows dynamics akin to a particle tunneling through a potential barrier, where application of a transverse field tunes both the barrier height and the effective mass of the particle (FIG. 1B).

The present work on disordered ferromagnets in the $LiHo_xY_{1-x}F_4$ series focuses primarily on samples with composition x~0.5, where long-range order survives even in the presence of considerable random site disorder. The phase diagram of FIG. 10 for x=0.44 results from the competition between terms in Eq. 1 with a complex ground state as T→0 that can be accessed differently via classical and quantum trajectories as well as domain dynamics that can be controlled with Γ. In the classical regime near the Curie point, $T_C$(x=0.44)=0.67 K, the critical behavior is dominated by random field effects due to the internal field $h_i$. The experiments reported here involve dc magnetization loops measured to large longitudinal (along the Ising axis) fields in both the classical (T~$T_C$) and quantum regimes. The application of a large longitudinal field polarizes the spins and erases the memory of a particular trajectory through the complex free energy landscape.

A commercial GaAs magnetometer (Toshiba THS118) with a (0.6×0.6) mm² active area was attached to a (0.8×0.8×3) mm³ single crystal $LiHo_{0.44}Y_{0.56}F_4$ needle, and the assembly was mounted in a differential configuration on the cold finger of a helium dilution refrigerator equipped with a 5T/2T vector magnet. The sample was cooled from above $T_C$ to the operating temperature in zero field and a series of transverse fields subsequently applied. Hysteresis loops were swept to ±2.5 kOe along the Ising axis, sufficient to saturate the magnetization for all temperatures and transverse fields and the Hall response was measured using standard lock-in amplifier techniques in the Ohmic and frequency-independent limits. The range of times probed was bounded from below by the response time of the instrumentation and from above by the 36 hour maximum interval between refills of the cryostat helium reservoir.

Figure 2:
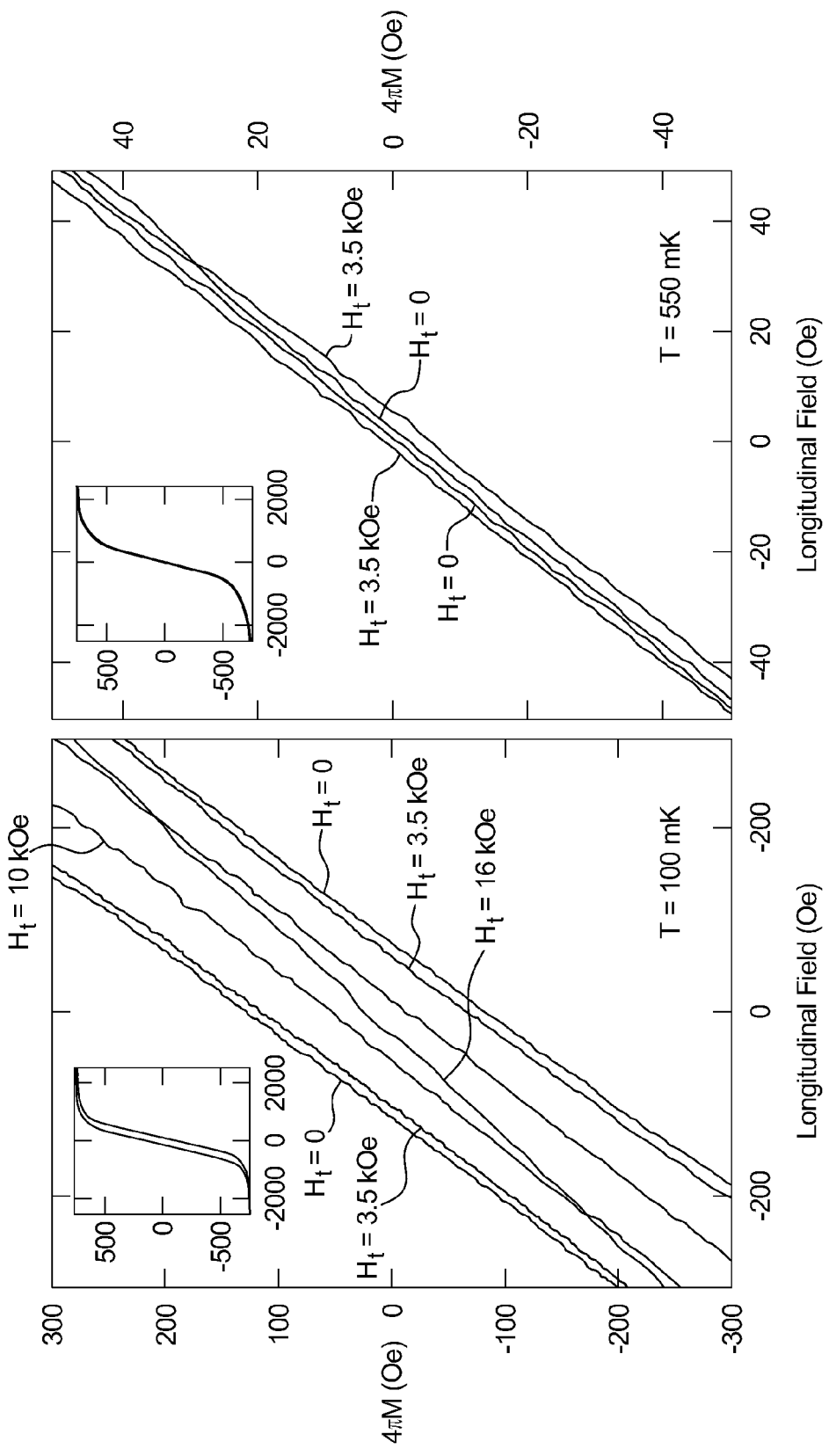
FIG. 2 illustrates magnetic hysteresis loops for $LiHo_{0.44}Y_{0.56}F_4$ in the quantum and classical random-field regimes. In the low-temperature quantum-dominated regime (illustrated in the graph on the left), applying a transverse field increases the tunneling rate, monotonically narrowing the hysteresis loop. In the high-temperature classical regime (illustrated in the graph on the right), applying a 3.5 kOe transverse field increases the effective pinning energy, widening the hysteresis loop.

FIG. 2 captures a notable result, showing magnetic hysteresis loops for LiHo$_{0.44}$Y$_{0.56}$F$_4$ taken to saturation at two temperatures. At low temperature (T≪T$_C$), where the dynamics are dominated by quantum mechanics, applying a transverse field results in a narrowing of the hysteresis loop due to the increase in domain wall tunneling (FIG. 1B). Near the Curie temperature, on the other hand, applying the same field results in the opposite behavior, with the loop broadening, indicating that the random fields increase the pinning. The transverse field thus can be used to either narrow or broaden the magnetic hysteresis, with temperature used to select which regime is in effect.

The dynamics of magnetization reversal can be explored quantitatively by examining how the area enclosed by the hysteresis loop changes as a function of temperature, field and sweep rate. The focus of FIG. 3 is the quantum-fluctuation-dominated (low temperature) regime. The enclosed area depends strongly on the time taken to traverse the loop (shown in the upper graph of FIG. 3). As the rate of change of the longitudinal field is reduced, the area of the loop shrinks monotonically, indicating that even over the 36-hour time span of the slowest loops, the system is still approaching equilibrium, underscoring once again the need to explicitly account for finite frequency effects due to slowly relaxing spin clusters at low T. The infinite-time behavior may be estimated by fitting the data to $A=A_0+A_i|dH_l/dt|^{1/2}$, where area $A=\oint 4\pi MdH$ integrated around a complete hysteresis loop. This experimentally observed form follows the $t^{-1/2}$ approach to equilibrium predicted for Ising systems based on domain coarsening models.

As seen in lower graph of FIG. 3, the behavior of the system for T=200 mK remains essentially unchanged until H$_t$=3.5 kOe. With increasing transverse field and hence an increasingly larger term proportional to σ$_x$ in the Hamiltonian of Eq. 1, the tunneling rate increases, and the macroscopic hysteresis loop narrows monotonically; previous studies have shown that the reversal proceeds by groups of up to 10 spins tunneling coherently. The observed H$_t$=3.5 kOe onset for the narrowing corresponds to a crossover seen in the nonlinear dynamics of strongly diluted LiHo$_{0.045}$Y$_{0.955}$F$_4$, suggesting that a transverse-field-induced level crossing in the full microscopic Hamiltonian, including nuclear hyperfine terms, is required before there is a significant probability of domain reversal via quantum tunneling. Above 3.5 kOe, the domain walls are still localized to some extent by the pinning centers, until their tunneling delocalizes them sufficiently for the hysteresis loop to close, with the enclosed area going to zero at the phase transition from ferromagnet to paramagnet, independently established via ac susceptibility. One can thus think of the quantum phase transition in this disordered ferromagnet as an Anderson localization/delocalization transition, where domain walls play the role of particles and form bands of extended states analogous to Bloch waves.

In the high-temperature, classical regime, different dynamics dominate the magnetization reversal. The ratio of k$_B$T to the energy barrier is sufficiently large that the primary mechanism for domain motion is thermally activated hopping. In this regime, loop areas exhibit a square-root dependence on the sweep rate at fast rates, but approach saturation at intermediate rates of order 25 Oe/min. FIG. 4A shows that the sweep rate determining the crossover to saturation is transverse field-independent within the ferromagnet, only changing at the transition into the paramagnet (FIG. 4C). Unlike the quantum-tunneling regime, which showed $t^{-1/2}$ behavior throughout the range of times investigated, it is possible at higher T to access a cut-off length scale for the coarsening of domains, consistent with predictions for the random-field problem. An estimate for this length scale may be obtained via the relationship $$L \sim \left(\frac{4J}{h}\right)^2 \frac{k_B T}{8J/\ln t},$$

where the ratio of temperature to the bare coupling constant k$_B$T/J=0.36 for T=0.55 K, the ratio of the strength of the random field to the bare coupling constant h/J~0.3 for LiHo$_{0.44}$Y$_{0.56}$F$_4$ in a 3.5 kOe transverse field, and t=6×10$^{13}$ is a dimensionless time set by the product of the 10$^{10}$ Hz attempt frequency for single-spin reversal and the 100 minutes required to sweep the longitudinal field from saturation to zero. These values yield an equilibrium domain size ~0.14 μm (260 unit cells) on a side, a cut-off scale an order of magnitude smaller than the ~5 μm domains observed in pure LiHoF$_4$.

The transverse field dependence of the loop area is mapped in FIG. 4B. Unlike what is seen for the lower temperature data in FIG. 3B, the hysteresis is non-monotonic with field, actually increasing with increasing transverse field up to H$_t$=3.5 kOe and then decreasing. As the strength of the random-field term in Eq. 1 is increased, the effective pinning of the domains increases as well. For H$_t$>3.5 kOe, quantum fluctuations once again accelerate domain reversal and the loop begins to narrow, eventually vanishing at the H$_t$=5 kOe paramagnetic phase boundary. At higher T, where the ferromagnetic order is quenched for H$_t$≤3.5 kOe, the main effect of the transverse field is to increase the pinning forces, in sharp contrast to the lower temperature regime closer to the quantum critical point, where the dominant effect of the transverse field is to increase quantum fluctuations.

While the present disclosed examples have been carried out for a model magnet with a low Curie point, mixed rare earth/transition metal alloys may be tailored to produce anisotropic magnets where transverse external fields yield tuneable internal random fields at room temperature, hence opening the door for technological application of these effects. For example, the ferromagnet may include one or more elements selected from the group consisting of: Ag, Au, Ce, Co, Cr, Dy, Er, Fe, Gd, Ho, Mn, Mo, Nb, Nd, Ni, Pd, Pt, Re, Rh, Ru, Sm, Ta and Y. Examples of high-anisotropy disordered magnets include many which have already attracted interest as perpendicular recording media. Table 1, which was generated based on data provided in Weller et al., gives compounds with their anisotropy energies and coercive fields (coercivities). The use of these magnets or similar such compounds near room temperature in a similar way to the above-described use of the rare earth fluorides at low temperature may be commercially advantageous.

TABLE 1

Exemplary hard magnetic materials and their properties (from Weller et al., "High Ku Materials Approach to 100 Gbits/in2," IEEE Transactions on Magnetics, Vol. 36, No. 1, January 2000)

| alloy system | material | $K_u$ ($10^7$erg/cm$^3$) | $M_S$ (emu/cm$^3$) | $H_K$ (kOe) | $T_C$ (K) | $\delta_W$ (Å) | $\gamma$ (erg/cm$^3$) | $D_C$ (μm) | $D_p$ (nm) |
|---|---|---|---|---|---|---|---|---|---|
| Co-alloys | CoPtCr | 0.20 | 298 | 13.7 | — | 222 | 5.7 | .89 | 10.4 |
| | Co | 0.45 | 1400 | 6.4 | 1404 | 148 | 8.5 | .06 | 8.0 |
| | Co$_3$Pt | 2.0 | 1100 | 36 | — | 70 | 18 | .21 | 4.8 |
| Ll$_0$ phases | FePd | 1.8 | 1100 | 33 | 760 | 75 | 17 | .20 | 5.0 |
| | FePt | 6.6-10 | 1140 | 116 | 750 | 39 | 32 | .34 | 3.3-2.8 |
| | CoPt | 4.9 | 800 | 123 | 840 | 45 | 28 | .61 | 3.6 |
| | MnAl | 1.7 | 560 | 69 | 650 | 77 | 16 | .71 | 5.1 |
| rare-earth transition metals | Fe$_{14}$Nd$_2$B | 4.6 | 1270 | 73 | 385 | 46 | 27 | .23 | 3.7 |
| | SmCo$_5$ | 11-20 | 910 | 240-400 | 1000 | 22-30 | 42-57 | .71-.96 | 2.7-2.2 |

Whether quantum tunneling of domains can be dialed in at elevated temperatures for other materials is a more difficult question. The high characteristic energy scales for transition metals and their oxides might allow for some progress should these scales be switchable optically, piezoelectrically, or via an electrical gate.

The potential use of a transverse magnetic field instead of a heating laser for manipulating coercive fields may obviate the need for multifunctional write heads that provide both heating and an applied magnetic field. The inventive technology may also avoid the thermodynamic problems of preserving the states of bits adjacent to those being written.

Figure 5:
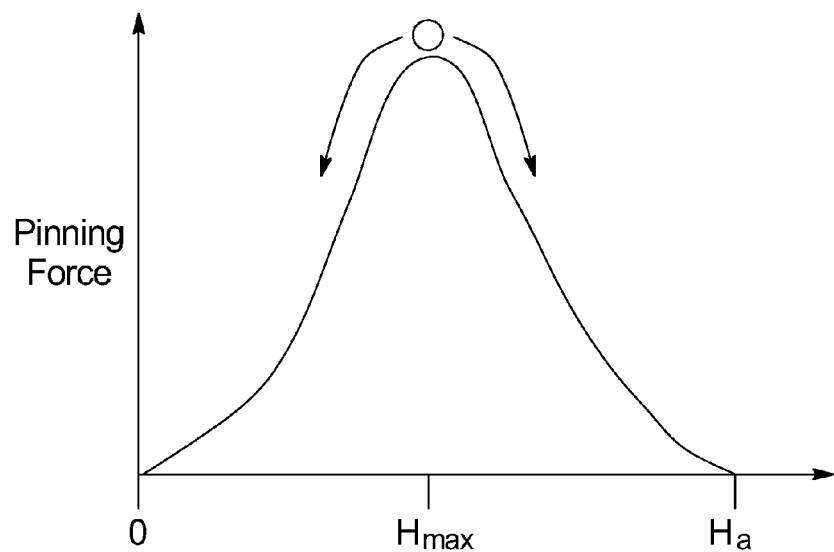
FIG. 5 shows pinning force versus applied transverse field. At $H_{max}$ the pinning force is maximized for long-term retention. The pinning force can be reduced, softening the magnet for writing, by either decreasing the applied field towards zero or increasing it towards the anisotropy field.

A special feature of the mechanism described here for controlling domain pinning is that the pinning forces grow with increasing transverse field, as long as they are well below the anisotropy field. As they approach the anisotropy field, the pinning forces decline again. Referring to FIG. 5, which shows pinning force versus applied transverse field, it can be seen that at $H_{max}$ the pinning force is maximized for long-term retention. Away from the write head, long-term retention of data requires sitting at or near the peak of the pinning force and necessitates a nonzero magnetic field across the bulk of the device. This then suggests two mechanisms for softening the magnet for writing. One can either oppose the static magnetic field to move the net field closer to zero, or apply a field in addition to the static field to move closer to the anisotropy (see FIG. 5) field, beyond which the magnetization is fully parallel with the applied transverse field.

The magnetic medium may use a thin film of material such as one those listed in Table 1; these films can be deposited by common methods such as sputtering, CVD, or pulsed laser ablation. The deposition process, alloy composition and substrate may be arranged so that the easy magnetic axis is well defined as being either in the plane of the film or perpendicular to that plane.

In the case of a fixed medium such as that needed for magnetic random access memory (MRAM), the anisotropy axis can be oriented in any direction that is compatible with the fabrication processes for the rest of the device. MRAM may be formed from two ferromagnetic plates, each of which can hold a magnetic field, separated by a thin insulating layer. One of the two plates may be a permanent magnet set to a particular polarity, with the other's field will change to match that of an external field. A memory device may be built from a grid of such "cells". In particular, MRAM devices may generally include a memory cell including a free magnetic layer separated from a pinned magnetic layer by an insulating layer, and an antiferromagnetic layer adjacent to the pinned magnetic layer. A bit line or top electrode overlies the memory cell, and a word line or bottom electrode underlies the memory cell and runs perpendicular to the top electrode. The free and pinned magnetic layers of the memory cell are formed of ferromagnetic materials. The magnetization of the free magnetic layer can change, and the magnetization of the pinned magnetic layer is fixed or pinned, generally by the antiferromagnetic layer adjacent to the pinned layer. With this configuration, the electrical conduction through the device changes based on the magnetization direction of the free layer with respect to that of the pinned layer.

If the two layers are magnetized in the same direction, the thin film stack has a low resistance and tunneling through the insulating layer can occur, but if the magnetization is in opposing or different directions, the stack has a high resistance and conduction through the tunnel barrier (the insulating layer) is limited. The absence or presence of tunneling current is read as a bit of information. Specifically, reading may be accomplished by measuring the electrical resistance of the cell. A particular cell may be selected by powering an associated transistor which switches current from a supply line through the cell to ground. Due to the magnetic tunnel effect, the electrical resistance of the cell may change due to the orientation of the fields in the two plates. By measuring the resulting current, the resistance inside any particular cell can be determined, and from this the polarity of the writable plate. Typically if the two plates have the same polarity this may be considered to mean "0", while if the two plates are of opposite polarity the resistance will be higher and this may indicate a "1". Employing the principles described herein, a magnet may be positioned adjacent to the memory cell and configured to apply a magnetic field transverse to the direction of magnetization of at least one of the free magnetic layer and the pinned magnetic layer in order to manipulate domain pinning in one or both layers.

For a rotating medium as in a hard drive (or other type of storage device), careful thought regarding the orientation of the anisotropy axis is warranted, because the rotation of the entire medium restores in-plane symmetry on the timescale of magnetic domain relaxation. For example, in the rest frame of the magnetic medium, the in-plane pinning fields generated by a fixed external field will rotate at the rate of the revolution of the disk.

Figure 6:
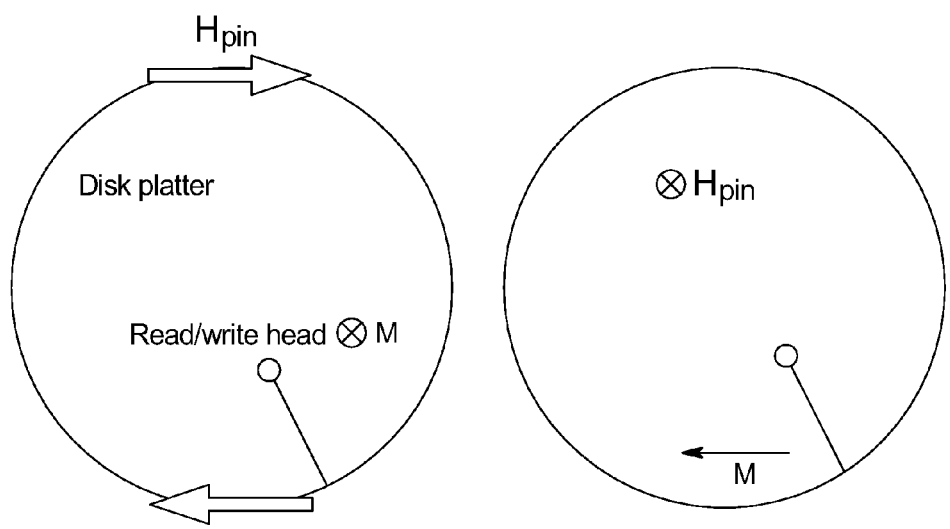
FIG. 6 illustrates two implementations of permanent magnetic pinning fields on a rotating disk. For magnetic materials with a preferred orientation perpendicular to the disk, permanent magnets in the plane of the disk and rotating with it could provide the pinning field; they could be derived from an undercoating or an overcoating of the actual disk medium (the configuration depicted on the left). For in-plane magnetization defining bit states, a magnet perpendicular to the disk provides the pinning (the configuration depicted on the right).

A current read head may be simply adapted for independent manipulation of coercive fields and bit states by adding another magnetic core controlled by a separate coil. Two such implementations are shown schematically in FIG. 6, taking into account the behavior illustrated in FIG. 5 and platter rotation. In particular, for magnetic materials with a preferred orientation perpendicular to the disk, permanent magnets in the plane of the disk could provide the pinning field; they could be derived from an undercoating or an overcoating of the actual disk medium. For in-plane magnetization defining bit states, a magnet perpendicular to the disk provides the pinning.

This potential implementation takes advantage of another mechanism for producing pinning in disordered magnetic substances, and may find its use in multilayered structures consisting of ferromagnets whose domains are pinned by adjacent antiferromagnets. The field applied by an external coil creates a pinning field in a disordered antiferromagnet, which in turn will increase the field required to switch the adjacent ferromagnet. A small random field depinning magnet could also be added to the read head itself. When in use, this magnet may be switched opposite to the main pinning magnet prior to switching the field along the polarization direction.

The technique described here for controlling the hardness of disordered anisotropic thin-film magnets also has applicability to bulk magnets made from similar materials. Such magnets would have potential applicability as braking systems in electric motors, and would also allow for the design of large adjustable inductors, of interest for the control of power systems.

To summarize, a method for manipulating domain pinning and reversal in a ferromagnetic material has been described. The method includes applying an external magnetic field to a uniaxial ferromagnetic material comprising a plurality of magnetic domains that each have an easy axis oriented along a predetermined direction. The external magnetic field is applied transverse to the predetermined direction and at a predetermined temperature. The strength of the external magnetic field is varied at the predetermined temperature, thereby isothermally regulating pinning of the magnetic domains.

Applying the external magnetic field may entail generating a site-random magnetic field in the ferromagnetic material, according to one embodiment. Applying the external magnetic field may comprise inducing quantum fluctuations in the ferromagnetic material, according to another embodiment.

The strength of the external magnetic field may be increased at the predetermined temperature, and increasing the strength of the external magnetic field may comprise increasing a pinning force of the magnetic domains. For example, the strength of the external magnetic field may be increased to a value maximizing the pinning force. Alternatively, increasing the strength of the external magnetic field may entail decreasing a pinning force of the magnetic domains. For example, the strength of the external magnetic field may be increased to a value approaching an anisotropy field of the ferromagnetic material.

The predetermined temperature at which the strength of the external magnetic field is varied may be at or about room temperature. In some cases, the predetermined temperature may be near the Curie point of the ferromagnetic material. Alternatively, the predetermined temperature may be sufficiently far below the Curie point of the ferromagnetic material so as to be in a quantum mechanical regime.

The ferromagnetic material may include one or more metals selected from the group consisting of transition metals and rare earth metals. For example, the one or more metals may be selected from the group consisting of Ag, Au, Ce, Co, Cr, Dy, Er, Fe, Gd, Ho, Mn, Mo, Nb, Nd, Ni, Pd, Pt, Re, Rh, Ru, Sm, Ta and Y. The ferromagnetic material may be a bulk ferromagnet or a thin-film ferromagnet. In one example, the ferromagnetic material may be a thin-film ferromagnet which is part of a magnetic hard disk. The predetermined direction along which the easy axis is oriented may be perpendicular to the surface of the magnetic hard disk or in the plane of the surface of the magnetic hard disk.

A magnetic storage device configured for isothermal regulation of magnetic domain pinning has also been described. The device includes a magnetic hard disk comprising a ferromagnetic material having uniaxial anisotropy, where the ferromagnetic material comprises a plurality of magnetic domains that each have an easy axis oriented along a predetermined direction. The device also comprises a magnetic recording head that includes a first magnet and is spaced apart from the magnetic hard disk by a head-disk spacing, and a second magnet adjacent to the magnetic hard disk that is configured to apply a magnetic field to the ferromagnetic material transverse to the predetermined direction. The predetermined direction may be perpendicular to the surface of the magnetic hard disk and the second magnet may be disposed on the plane of the surface. Alternatively, the predetermined direction may be in the plane of the surface of the magnetic hard disk and the second magnet may be disposed perpendicular to the surface.

The magnetic storage device may be an MRAM device configured for isothermal regulation of magnetic domain pinning. In this embodiment, the device includes a memory cell including a free ferromagnetic layer separated from a pinned ferromagnetic layer by an insulating layer, the pinned ferromagnetic layer being adjacent to an antiferromagnetic layer. Each of the free ferromagnetic layer and the pinned ferromagnetic layer comprise a plurality of magnetic domains. The domains of the free ferromagnetic layer have an easy axis oriented along a first direction and the domains of the pinned ferromagnetic layer have an easy axis oriented along a second direction. A first electrode overlies the memory cell and a second electrode underlies the memory cell, and the electrodes are oriented perpendicular to each other. A magnet is adjacent to the memory cell and is configured to apply a magnetic field transverse to at least one of the first and second directions.

Although the present invention has been described in considerable detail with reference to certain embodiments thereof, other embodiments are possible without departing from the present invention. The spirit and scope of the appended claims should not be limited, therefore, to the description of the preferred embodiments included here. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method for manipulating domain pinning and reversal in a ferromagnetic material, the method comprising:
applying an external magnetic field to a uniaxial ferromagnetic material comprising a plurality of magnetic domains each having an easy axis oriented along a predetermined direction, the external magnetic field being applied transverse to the predetermined direction and at a predetermined temperature; and
varying a strength of the external magnetic field at the predetermined temperature, thereby isothermally regulating pinning of the magnetic domains,
wherein, below a value $H_{max}$ of the external magnetic field, increasing the strength of the external magnetic field comprises increasing a pinning force of the magnetic domains, and
wherein, above a value $H_{max}$ of the external magnetic field, increasing the strength of the external magnetic field comprises decreasing a pinning force of the magnetic domains.

2. The method of claim 1, wherein applying the external magnetic field comprises generating a site-random magnetic field in the ferromagnetic material.

3. The method of claim 1, wherein applying the external magnetic field comprises inducing quantum fluctuations in the ferromagnetic material.

4. The method of claim 1 wherein the strength of the external magnetic field is increased at the predetermined temperature.

5. The method of claim 1, wherein the strength of the external magnetic field is increased to the value $H_{max}$ maximizing the pinning force.

6. The method of claim 1 wherein the strength of the external magnetic field is increased to a value approaching an anisotropy field of the ferromagnetic material.

7. The method of claim 1 wherein the predetermined temperature is at or about room temperature.

8. The method of claim 1 wherein the predetermined temperature is near the Curie point of the ferromagnetic material.

9. The method of claim 1 wherein the predetermined temperature is sufficiently far below the Curie point of the ferromagnetic material so as to be in a quantum mechanical regime.

10. The method of claim 1 wherein the ferromagnetic material comprises one or more metals selected from the group consisting of: transition metals and rare earth metals.

11. The method of claim 10 wherein the one or more metals are selected from the group consisting of: Ag, Au, Ce, Co, Cr, Dy, Er, Fe, Gd, Ho, Mn, Mo, Nb, Nd, Ni, Pd, Pt, Re, Rh, Ru, Sm, Ta and Y.

12. The method of claim 1 wherein the ferromagnetic material is a bulk ferromagnet.

13. The method of claim 1 wherein the ferromagnetic material is a thin-film ferromagnet.

14. The method of claim 13 wherein the thin-film ferromagnet is part of a magnetic hard disk.

15. The method of claim 14 wherein the predetermined direction is perpendicular to a surface of the magnetic hard disk.

16. The method of claim 14 wherein the predetermined direction is in a plane of a surface of the magnetic hard disk.

17. The method of claim 1, wherein the uniaxial ferromagnetic material comprises random site disorder.

* * * * *